United States Patent [19]

Iwata et al.

[11] Patent Number: 5,389,923
[45] Date of Patent: Feb. 14, 1995

[54] SAMPLING RATE CONVERTER

[75] Inventors: Eiji Iwata, Tokyo; Takao Yamazaki, Kanagawa, both of Japan

[73] Assignee: Sony Corporation, Tokyo, Japan

[21] Appl. No.: 35,228

[22] Filed: Mar. 22, 1993

[30] Foreign Application Priority Data

Mar. 31, 1992 [JP] Japan .................................. 4-105978

[51] Int. Cl.$^6$ ............................................. H03M 7/00
[52] U.S. Cl. ........................................ 341/61; 348/441
[58] Field of Search ...................... 341/61, 50; 358/11, 358/133, 138

[56] References Cited

U.S. PATENT DOCUMENTS 5,159,339 10/1992 Fujita ..................................... 341/61

Primary Examiner—Sharon D. Logan
Attorney, Agent, or Firm—William S. Frommer; Alvin Sinderbrand

[57] ABSTRACT

In a sampling rate converter for converting a sampling frequency L of a digital signal to a sampling frequency M (L:M conversion) or for converting a sampling frequency M of a digital signal to a sampling frequency L (M:L conversion), the same filter coefficients are utilized and a constant predetermined DC gain is maintained for both conversions. An over-sampler multiplies the sampling frequency L or M by M or L, respectively, during the L:M conversion and the M:L conversion, respectively. A filter, which receives the output of the over-sampler, restricts the frequency band of the output. A CPU supplies filter coefficients to the filter and performs such functions as quantizing the filter coefficients, arranging the quantized filter coefficients into a three-dimensional array including rows and columns, determining a ratio between a total sum of values of the rows and columns of the array of quantized filter coefficients, and correcting each of the quantized filter coefficients in response to the determined ratio so as to maintain the predetermined DC gain. A down-sampler receives the output of the filter for multiplying the rate converted frequencies by 1/L or 1/M during the L:M conversion or the M:L conversion, respectively.

6 Claims, 11 Drawing Sheets

| $W_{0,0}$ | $W_{0,1}$ | $W_{0,2}$ | $W_{0,3}$ | dL −2 |
|---|---|---|---|---|
| $W_{1,0}$ | $W_{1,1}$ | $W_{1,2}$ | $W_{1,3}$ | +3 |
| $W_{2,0}$ | $W_{2,1}$ | $W_{2,2}$ | $W_{2,3}$ | −2 |
| dM −2 | −4 | +2 | +3 | |

FIG. 9A

| | | | | dL −2 |
|---|---|---|---|---|
| | | +2 | +1 | 0 |
| | | | | −2 |
| dM −2 | −4 | 0 | +2 | |

FIG. 9B

| | −2 | | | dL 0 |
|---|---|---|---|---|
| | | | | 0 |
| −1 | −1 | | | 0 |
| dM −1 | −1 | 0 | +2 | |

FIG. 9C

| −1 | | | +1 | dL 0 |
|---|---|---|---|---|
| | | | | 0 |
| | −1 | | +1 | 0 |
| dM 0 | 0 | 0 | 0 | |

FIG. 9D

SAMPLING RATE CONVERTER

FIELD OF THE INVENTION

This invention relates to a sampling rate converter, and is more particularly suitable for converting sampling frequencies of digital signals in two-way directions.

BACKGROUND OF THE INVENTION

Heretofore, it was necessary that video signals and audio signals which were digitally signalized with a predetermined format be converted to a different format. In this case, if sampling frequencies (L, M) of the digital signals were different from each other, the sampling frequencies (L, M) of the digital signals must be converted from a sampling frequency L to a sampling frequency M or, in contrast, be converted from a sampling frequency M to a sampling frequency L.

For example, an apparatus for converting sampling frequencies is a sampling rate converter. An example of a sampling rate converter is disclosed in U.S. Pat. No. 5,159,339. Functions and uses are explained in detail in this Patent.

Further, the sampling rate converter generally consists of a digital filter, an example of which is disclosed in Japanese Patent Application Laid-Open No. 42,909/89. Thus, the sampling rate converter constituted by a digital filter is known in the prior art.

Theoretically, the filter coefficient which is obtained when converting the sampling frequency from the frequency M to the frequency L, i.e., when converting by L/M times (hereinafter referred to as M:L conversion), can be the same in converting the sampling frequency from the frequency L to frequency M, i.e., when converting by M/L times (hereinafter referred to as L:M conversion).

However, in such a sampling rate converter, when the sampling rate is changed, the outputs (DC gain), in the case where direct current components (DC) are inputted in the sampling rate converter, fluctuate on every output. This is because of the quantization error when the filter coefficient is quantized.

Therefore, it is necessary to amend the value of filter coefficients after quantization in order to keep these changes, based on the DC gain, constant. In the conventional sampling rate converter, for example, when the filter coefficients are operated such that the DC gain at the M:L conversion is constant in all phases, the DC gain does not remain constant at the L:M conversion. Accordingly, the filter coefficient on the M:L conversion differs from the filter coefficient on the L:M conversion, and in order to realize the sampling rate converter which can perform both M:L and L:M conversions, it becomes necessary to have two independent sets of filter coefficients for the respective conversions. Further, in the case where only one set of filter coefficients is available based on hardware restrictions, the DC gain is not constant in either conversion periods.

SUMMARY OF THE INVENTION

In view of the foregoing, an object of this invention is to provide a sampling rate converter capable of keeping the DC gain constant during frequency conversion even in the case of converting the sampling rate in two-way directions with one set of filter coefficients.

The foregoing object and other objects of the invention have been achieved by the provision of a sampling rate converter 1 for converting a sampling frequency L of a digital signal to a sampling frequency M (L:M conversion) or for converting a sampling frequency M of a digital signal to a sampling frequency L (M:L conversion), while utilizing the same filter coefficients and maintaining a constant predetermined DC gain for both conversions. The sampling rate converter includes an over-sampler for multiplying sampling frequency L or M by M or L, respectively, during the L:M conversion and the M:L conversion, respectively. A rate converting filter receives the output of the over-sampler for restricting the frequency band of the output. The rate converting filter is supplied with filter coefficients by a central processing unit (CPU) which quantizes the filter coefficients, arranges the quantized filter coefficients into a three-dimensional array including rows and columns ($W_{l,m}(k)$, $E_{l,m}(k)$), determines a ratio between a total sum of values of the rows and columns of the array of quantized filter coefficients ($S_L(l)$, $S_M(m)$), and corrects each of the quantized filter coefficients in response to the determined ratio so as to maintain the predetermined DC gain. The output of the rate converting filter is supplied to a down-sampler for multiplying the rate converted frequencies by 1/L or 1/M during the L:M conversion or the M:L conversion, respectively.

The nature, principle and utility of the invention will become more apparent from the following detailed description when read in conjunction with the accompanying drawings in which like parts are designated by like reference numerals or characters.

BRIEF DESCRIPTION OF THE DRAWINGS

In the accompanying drawings:

FIG. 9 is a schematic view for explanation of the operation method for obtaining the filter coefficients by applying the Magic Square DC Gain Matching algorithm in FIG. 1;

DETAILED DESCRIPTION OF THE INVENTION

Preferred embodiments of this invention will be described with reference to the accompanying drawings:

(1) Principle of Sampling Rate Conversion

The principle of sampling rate conversion in response to the multi-rate digital signal processing applied to this embodiment will be discussed in the following paragraph. At first, a sampling rate of digital signals is converted to the M:L conversion, i.e., converted from sampling frequency M to sampling frequency L by multiplying by L/M. At this point, the sampling frequency after conversion, $f'_s$, can be expressed using the sampling frequency before conversion, $f_s$, as follows:

$$f'_s = \frac{L}{M} f_s \quad (1)$$

This M:L conversion is realized after the input list $x(n)$ by sampling frequency $f_s$ is over-sampled, i.e., multiplied by L, and down converted, i.e., multiplied by L/M. In the case where M is bigger than L (M>L), "down conversion" applies, and in the case where M is smaller than L (M<L), "up conversion" applies.

Figure 10A:
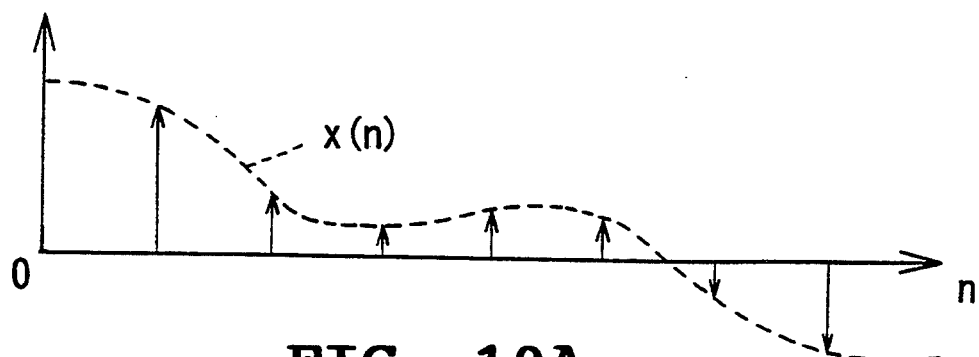
FIG. 10 is a signal waveform charts for explanation of the principle of sampling rate conversion according to the present invention.

FIGS. 10A to 10D are signal waveform charts for explanation of the principle of sampling rate conversion that apply to this invention. FIGS. 10A to 10D show the M:L conversion in the case where "M=4" and "L=3," i.e., "down conversion", and the process of M:L conversion is explained. As FIG. 10A shows, a list sampled by the initial signals having the sampling frequency $f_s$ becoming $x(n)$ and is referred to an input list of M:L conversion.

Figure 10B:
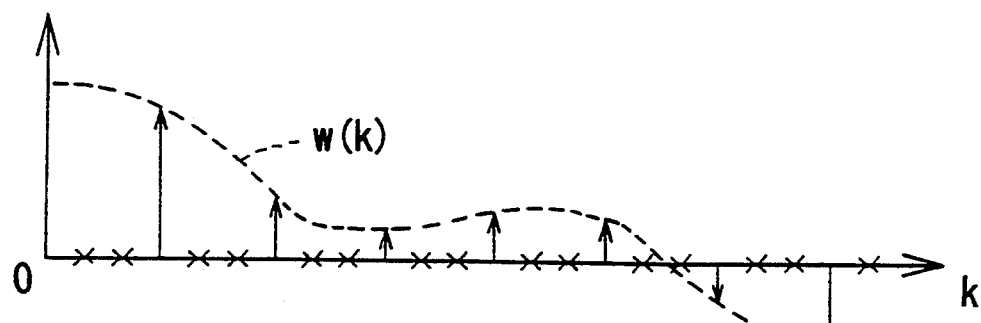

As shown in FIG. 10B, the input list $x(n)$ is over-sampled, i.e., multiplied by L. At this point, "L−1" numbers of zero samples (samples with "0" values) are inserted at equal intervals among samples of the input list $x(n)$, and this becomes the list $w(k)$. The sampling frequency of list $w(k)$ is "$L \cdot f_s$".

Figure 10C:
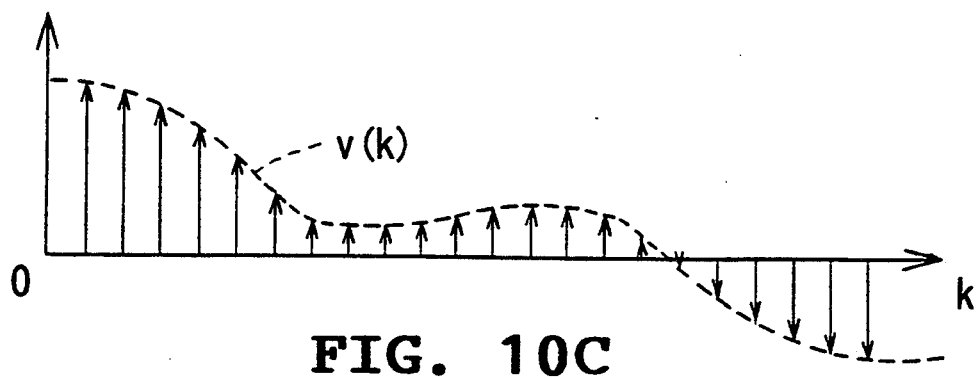

Furthermore, as shown in FIG. 10C, the list $w(k)$ is covered with a low-pass filter comprising digital filters to restrict the band to a minimum (for example, $f_s/2$, $f'_s/2$) and this output list of the low-pass filter is referred to as low-pass filter output list $v(k)$.

Figure 10D:
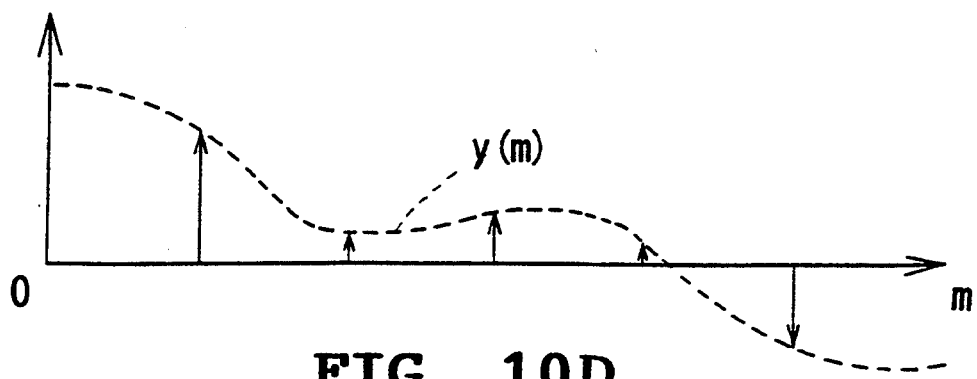

Moreover, as shown in FIG. 10D, the list which is down converted by 1/M times from the low-pass filter output list $v(k)$ is referred to as output list $y(m)$. The sampling frequency of this output list $y(m)$ is "$(L/M) \cdot f_s = (f'_s)$".

Figure 11:
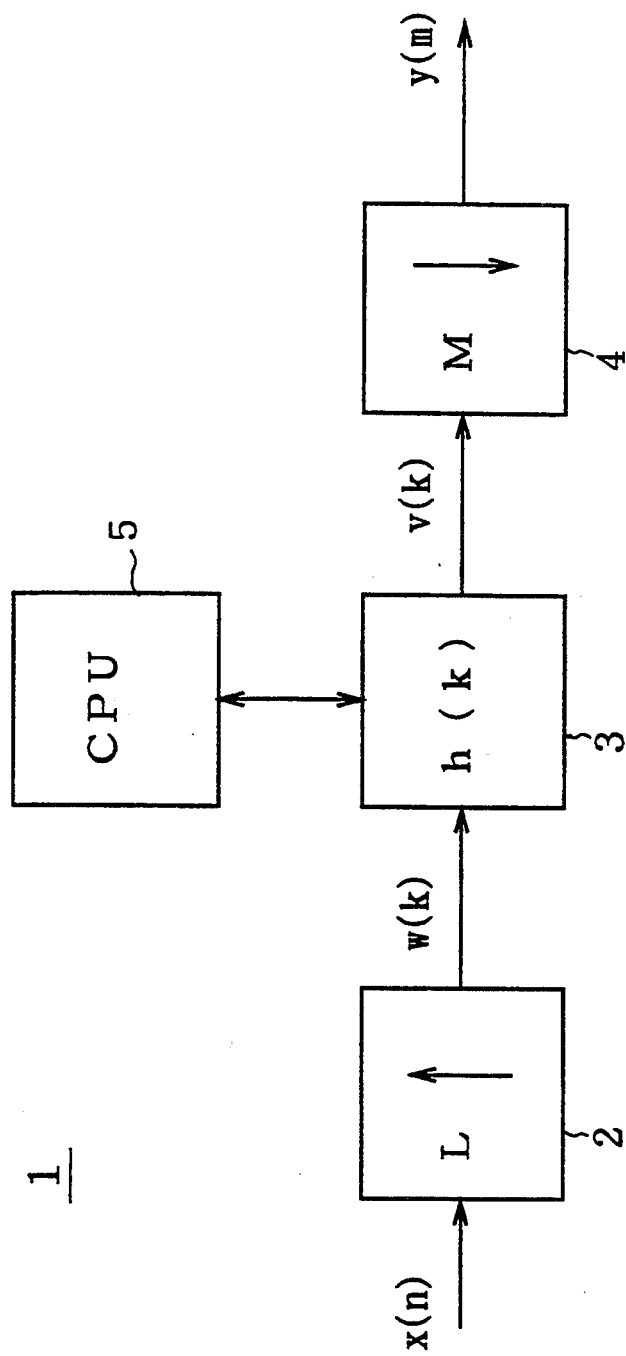
FIG. 11 is a block diagram showing the construction of one embodiment of a sampling rate converter according to the present invention.

The constitution of one embodiment of the sampling rate converter applicable to this invention, is shown by a block diagram in FIG. 11. This M:L conversion includes an over-sampler 2, a rate converting filter 3, a CPU 5 and a down-sampler 4. The low-pass filters, as described above in FIG. 10C, is referred to as rate converting filter 3. Further, although not illustrated, quantizes filter coefficients, arranges the quantized filter coefficients into a 3-dimensional array or matrix having rows and columns, determines a ratio between the total sum of values of the rows and columns, and corrects the quantized filter coefficients based on the determined ratio. These functions of CPU 5 will be explained in greater detail hereinlater.

It is apparent from FIGS. 10A to 10D that the output list $y(m)$ is one of the values wherein the phase of input list $x(n)$ is delayed by "360/L" degrees. The filter for obtaining these values respectively is called a sub-filter. The coefficients of the sub-filter is a subset consisting of values for every L coefficient of the rate converting filter 3.

(2) Condition of Sampling Rate Converter

The condition for setting the coefficients of the rate converting filter 3 in sampling rate converter 1 will be described for the case where the coefficients of the rate converting filter 3 are "$a_n$" (n=0, 1, 2 ... N−1). To simplify the matter, an order of the rate converting filter 3 is "N=j·M·L" (where "j" is a natural number).

In the first place, the coefficients of the rate converting filter 3 are divided into two respective groups: the sub-filter coefficient of M:L conversion and the sub-filter coefficient of L:M conversion. With this arrangement, there are L sets of M:L conversion sub-filter coefficients and an order "$N_p l$" becomes "$N_p l$" N/L". At this point, the M:L conversion sub-filter coefficient is expressed in the following equation.

$$A_L = [a_i, a_{L+i}, \ldots, a_{N-L+i}] \quad (2)$$

(where i=0, 1, 2, ..., L-b 1)

On the other hand, there are M sets of L:M conversion sub-filter coefficients and an order "$N_{pm}$" becomes "$N_{pm} = N/M$". At this point, the L:M conversion sub-filter coefficient is defined as follows:

$$A_M(i) = [a_i, a_{M+i}, a_{2M+i}, \ldots, a_{N-M+i}] \quad (3)$$

(where i=0, 1, 2, ..., M−1)

At this point, the conditions which can be expressed in the following equations are given to coefficients of the M:L conversion sub-filter and the L:M conversion sub-filter.

$$\sum_{j=0}^{N_{pl}-1} a_{Lj} = \sum_{j=0}^{N_{pl}-1} a_{Lj+1} = \ldots = \sum_{j=0}^{N_{pl}-1} a_{Lj+L-1} \quad (4)$$

$$\sum_{j=0}^{N_{pm}-1} a_{Mj} = \sum_{j=0}^{N_{pm}-1} a_{Mj+1} = \ldots = \sum_{j=0}^{N_{pm}-1} a_{Mj+M-1} \quad (5)$$

If the coefficients of the rate converting filter 3 satisfy the conditions described above in both equations (4) and (5), it is possible to use the same coefficient of rate converting filter 3, not only in the M:L conversion but also in the L:M conversion.

(3) Magic Square DC Gain Matching

The filter coefficients in sampling rate Converter 1 are operated in such a manner that the DC gain remains constant for both M:L converting and L:M converting by utilizing an algorithm called "Magic Square DC Gain Matching". As a result, a set of filter coefficients can be held in common for realizing both M:L conversion and L:M conversion.

An algorithm of the Magic Square DC Gain Matching is explained hereinafter. The Magic Square DC Gain Matching comes into operation where a filter coefficient after quantization is "$a_q(n)$" (n=0, 1, 2 N−1) and where a quantization error between coefficients before quantization $a(n)$ is $e_q(n) = a(n) - a_q(n)$.

This algorithm is designed in order to minimize the increase of quantization errors between the filter coefficients. To simplify the matter, the filter order is "N=j·M·L" (where "j" is a natural number). Also, coefficient standardization, in the case of quantization operation, is performed in order to satisfy the following equation:

$$\sum_{m=0}^{N-1} a(n) = N \cdot L \cdot 2^{bc} \quad (6)$$

Where "bc" is a bit length of the coefficients.

(3-1) Preparation for Magic Square DC Gain Matching

As preparation for the Magic Square DC Gain Matching, the filter coefficient $a_q(n)$, after quantization, is substituted with a three-dimensional array defined in the following equation:

$$W_{l,m}(k) = \begin{matrix} W_{0,0}(k) & W_{0,1}(k) & \ldots & W_{0,M-1}(k) \\ W_{1,0}(k) & W_{1,1}(k) & \ldots & W_{1,M-1}(k) \\ \vdots & \vdots & & \vdots \\ W_{L-1,0}(k) & W_{L-1,1}(k) & \ldots & W_{L-1,M-1}(k) \end{matrix}$$

where $W_{l,m}(k) = a_q(n)$, $l = \mod\{n/L\}$, $m = \mod\{n/L\}$ $$k = [n/(M \cdot L)] \text{ (gauss symbol)} \quad (7)$$

and simultaneously, the quantization error $e_q(n)$ is substituted for a three dimensional array $El_{,m}(k)$.

Then, the total sum $S_L(l)$ of L numbers of M:L conversion sub-filter coefficients are obtained by the following equation:

$$S_L(l) = \sum_{m=0}^{M-1} \sum_{k=0}^{j} W_{l,m}(k) \quad (8)$$

$(l = 0, 1, 2, \ldots, L-1)$

In the similar way, the total sum $S_M(m)$ of M numbers of L:M conversion sub-filter coefficients are obtained by the following equation:

$$S_M(m) = \sum_{l=0}^{L-1} \sum_{k=0}^{j} E_{l,m}(k) \quad (9)$$

$(m = 0, 1, 2, \ldots, M-1)$

At this point, in order to keep the DC level constant, the conditions to be expressed in the following equation (10) will be applied to the M:L conversion sub-filter rather than equations (4) and (6) stated above:

$$S_L(0) = S_L(1) = S_L(2) = \ldots = S_L(L-1) = M \cdot 2^{bc} \quad (10)$$

In a similar way, regarding the L:M conversion sub-filter, the conditions to be described in the following equation (11) will be applied rather than equation (5) and (6) stated above:

$$S_M(0) = S_M(1) = S_M(2) \ldots = S_M(M-1) = L \cdot 2^{bc} \quad (11)$$

Accordingly, if the array element $wl_{,m}(k)$ can be manipulated to satisfy the conditions of equations (10) and (11) simultaneously, the DC level can be constant in both directions of the M:L conversion sub-filter and the L:M conversion sub-filter.

Such operation is called "magic square DC gain matching" because an array having respective sums of numbers in the direction of respective columns and rows that are constantly equalized are formed.

The target value and errors of respective coefficients of the M:L conversion sub-filter and L:M conversion sub-filter are defined for performing this operation by the following equations, respectively:

$$d_L(l) = M \cdot 2^{bc} - S_L(l) \; (l=0,1,2 \ldots, L-1) \quad (12)$$

$$d_M(m) = L \cdot 2^{bc} - S_M(l) \; (m=0,1,2 \ldots, M-1) \quad (13)$$

where $d_L(l)$ and $d_M(m)$ of equations (12) and (13) are error sequences. In respect to error sequences $d_L(l)$ and $d_M(m)$, the following equation can be defined:

$$\sum_{l=0}^{L-1} d_L(l) = \sum_{m=0}^{M-1} d_M(m) \quad (14)$$

(3-2) Algorithm of Magic Square DC Gain Matching

Figure 1:
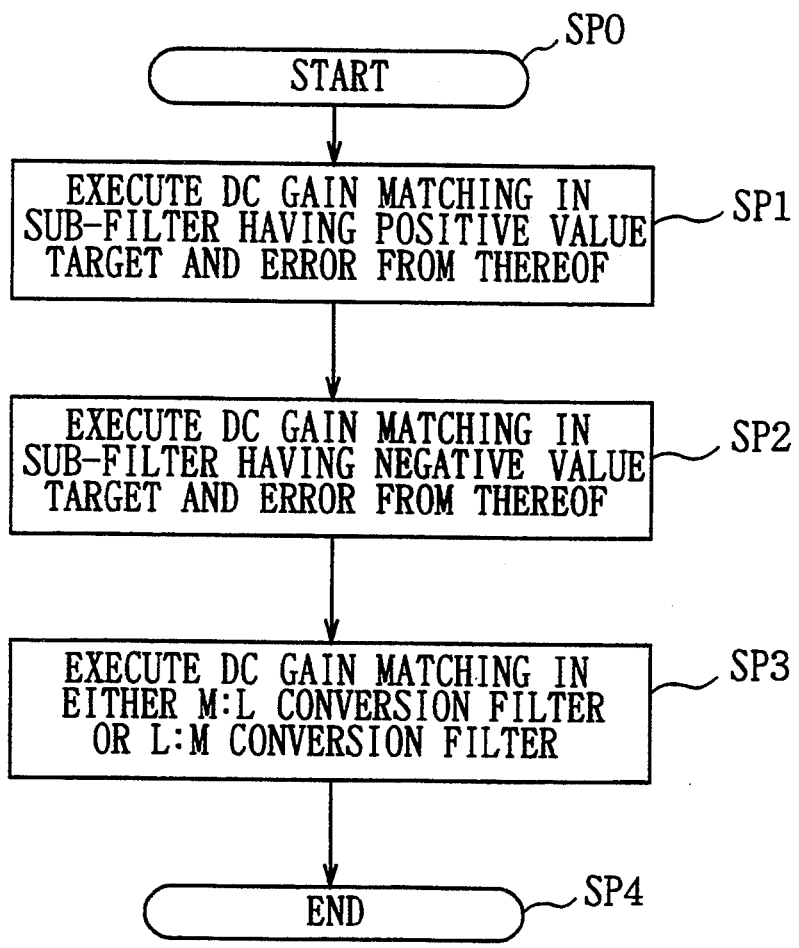
FIG. 1 is a flow chart showing an algorithm of one embodiment of the Magic Square DC Gain Matching for obtaining filter coefficients of the sampling rate converter in the present invention.

At this point, the magic square DC gain matching process is performed in a computer system having a CPU 5. When the magic square DC gain matching process is designated, CPU 5 executes an algorithm of the magic square DC gain matching processing program SP0 as shown in FIG. 1.

Figure 2:
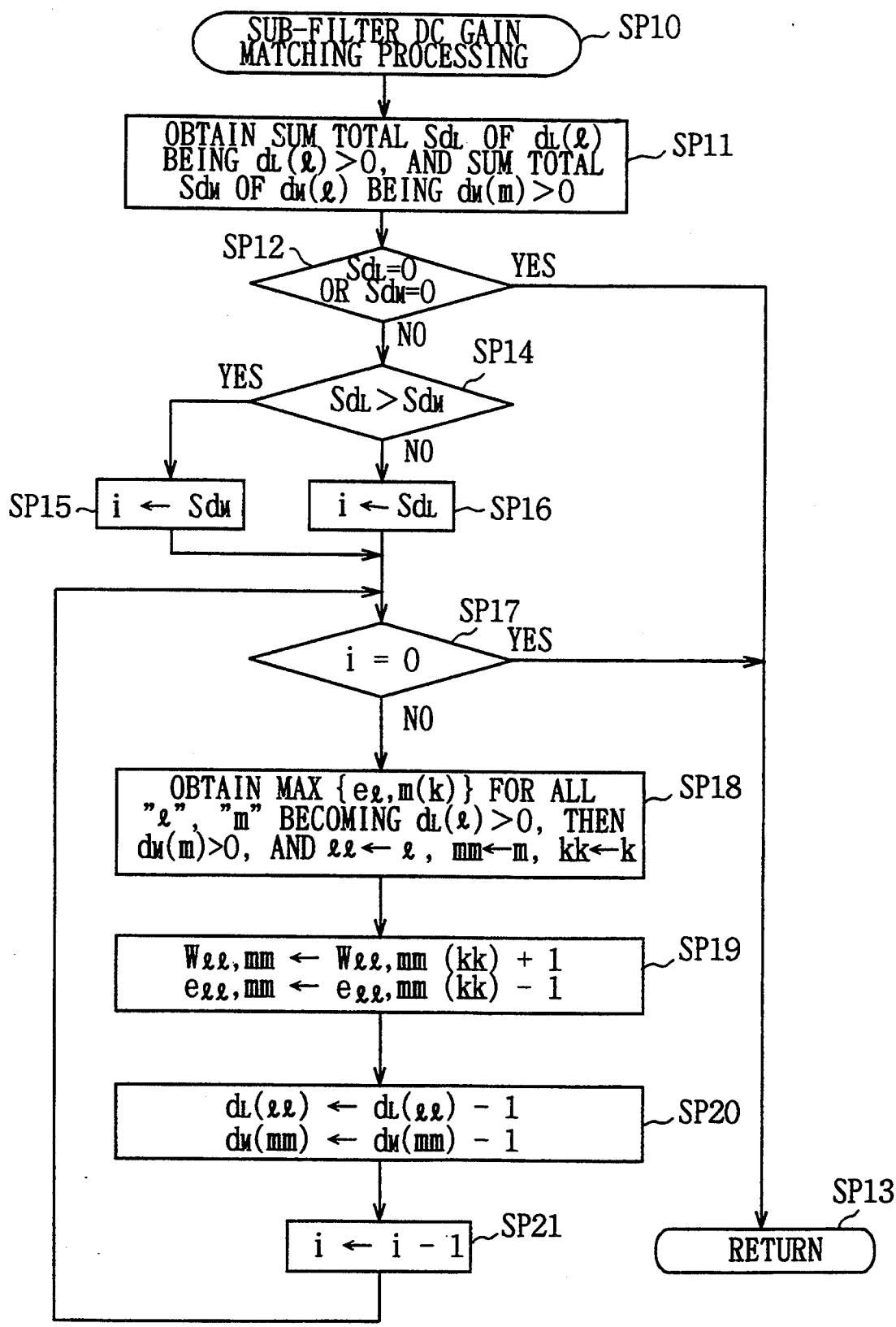
FIG. 2 is a flow chart showing an algorithm of the sub-filter DC gain matching at the first subroutine of the Magic Square DC Gain Matching algorithm in FIG. 1.

More specifically, CPU 5 enters from the magic square DC gain matching processing program SP0. The next step SP1 is shown in detail in FIG. 2. Step S10 executes a subroutine of the first sub-filter DC gain matching processing program in order to execute the DC gain matching in the sub-filter having a positive value error from the target value.

Practically, at Step SP10, the DC gain matching is performed in the sub-filter having the positive value error from the target value, i.e., the sub-filter having a smaller total sum of coefficients than the target value. Processing then proceeds to step SP11.

At step SP11, the CPU obtains the total sums $S_{dL}$ and $S_{dM}$ regarding each of the error sequences $d_L(l)$ and $d_M(m)$, respectively, having values greater than zero. Then, at step SP12, a determination is made as to whether at least one of the total sums ($S_{dL}$ or $S_{dM}$) are zero. If the determination is answered in the affirmative the CPU proceeds to step SP13, terminates the sub-filter DC gain matching processing program SP10 and continues to step SP2 of FIG. 1.

If the inquiry of step S12 is negative, the CPU executes steps SP14–SP16 and selects one of the total sums ($S_{dL}$ or $S_{dM}$) having the small absolute value and that absolute value becomes "i" (if both absolute values are the same, either one will be acceptable). Then, the CPU executes steps SP17–SP21 until the value of "i" becomes "0" and obtains the maximum values of ($el_{,m}(k)$ for all "l" and "m" having the total sums "$d_L(l) > 0$" and "$d_M(m) > 0$" and performs the calculations in the following equations, where "l", "m" and "k" have corresponding maximum values "ll", "ram" and "kk", respectively:

$$W_{ll,mm}(kk) = W_{ll,mm}(kk) + 1 \quad (15)$$

$$e_{ll,mm}(kk) = e_{ll,mm}(kk) - 1 \quad (16)$$

$$d_L(ll) = d_L(ll) - 1 \quad (17)$$

$$d_M(mm) = d_M(mm) - 1 \quad (18)$$

At step SP21, "i" becomes "i−1", and when "i" becomes "0", the CPU moves from step SP17 to step SP13, terminates said sub-filter DC gain matching processing program SP10 and proceeds to step SP2 of the magic square DC gain matching processing program SP0.

Figure 3:
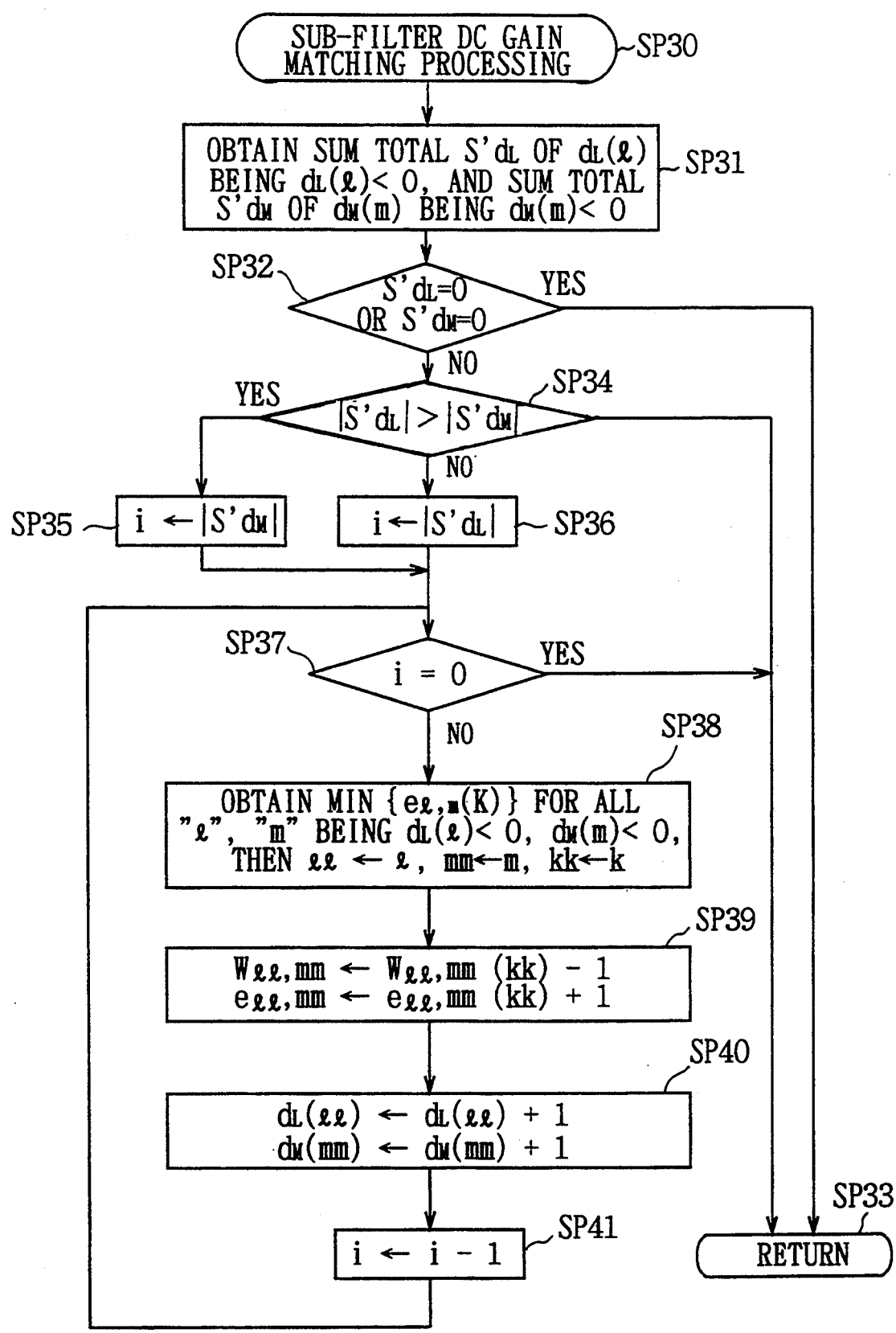
FIG. 3 is a flow chart showing an algorithm of the sub-filter DC gain matching at the second subroutine of the Magic Square DC Gain Matching algorithm in FIG. 1.
Figure 4:
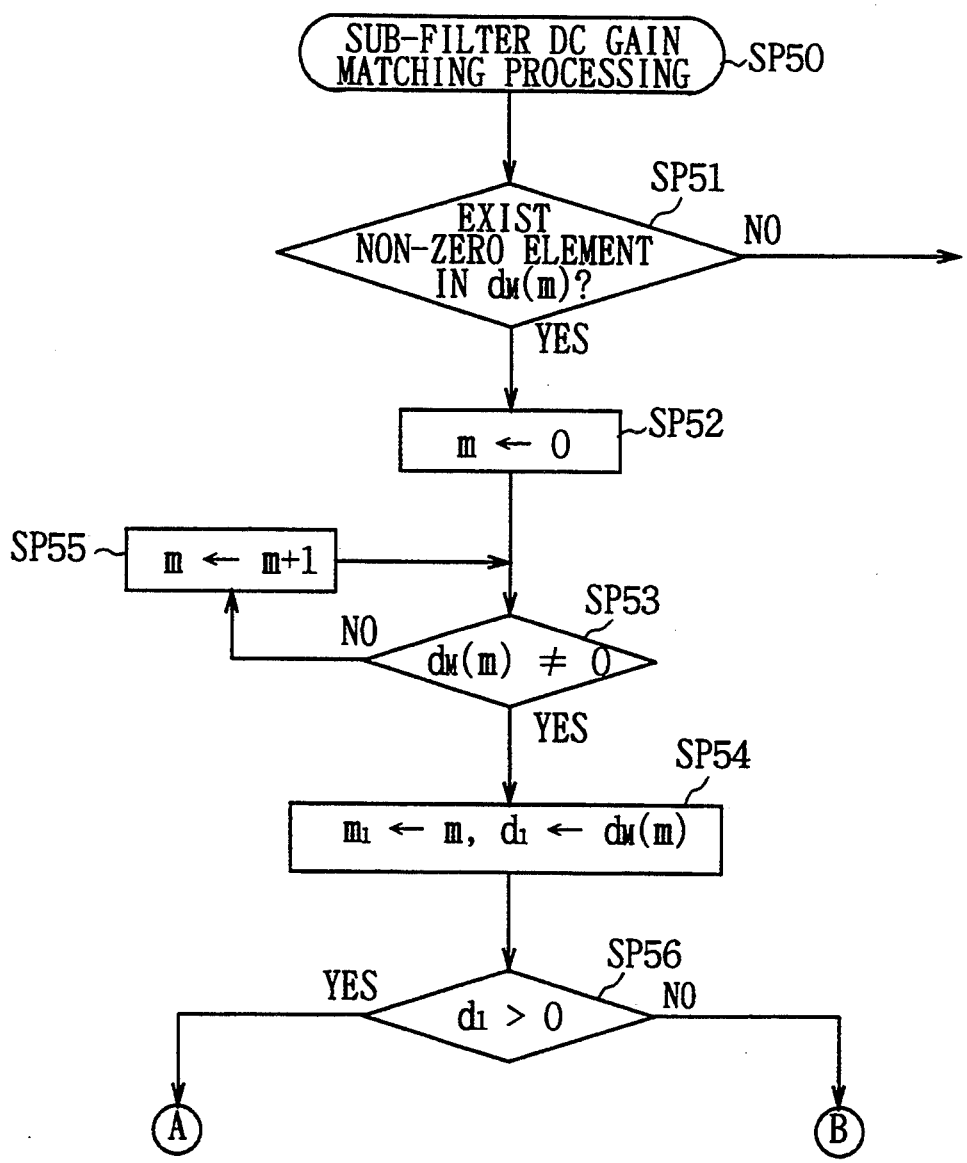
FIG. 4 is a flow chart showing an algorithm of the sub-filter DC gain matching at the third subroutine of the Magic Square DC Gain Matching algorithm in FIG. 1.
Figure 5:
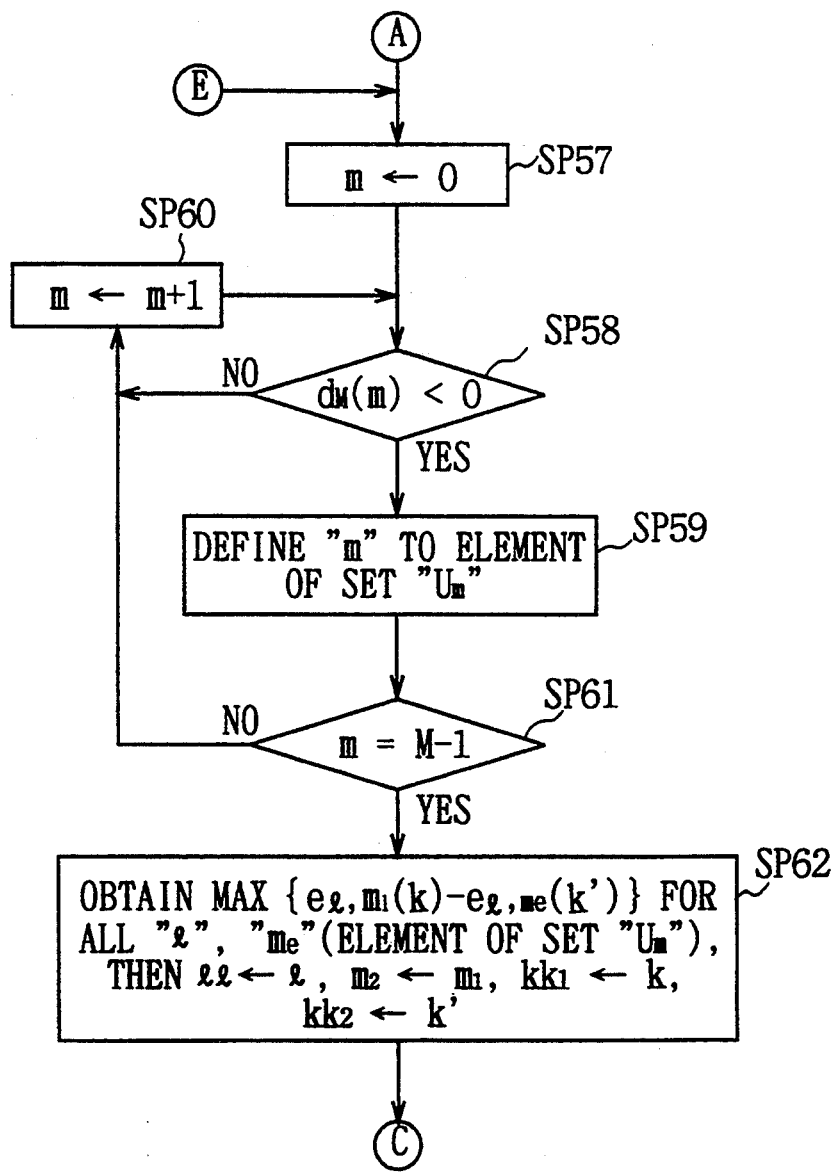
FIG. 5 is a flow chart showing an algorithm of the sub-filter DC gain matching as same as FIG. 4.
Figure 6:
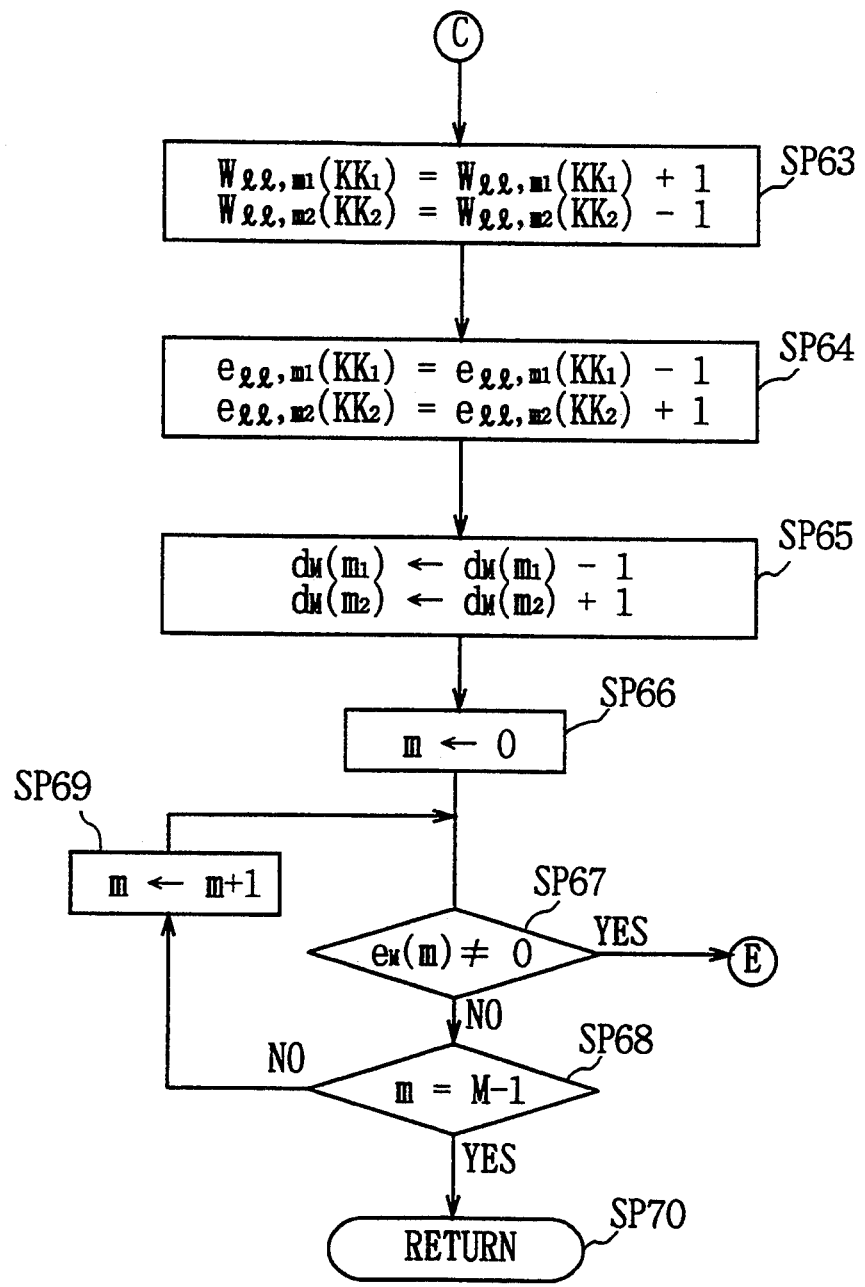
FIG. 6 is a flow chart showing an algorithm of the sub-filter DC gain matching as same as FIG. 4.
Figure 7:
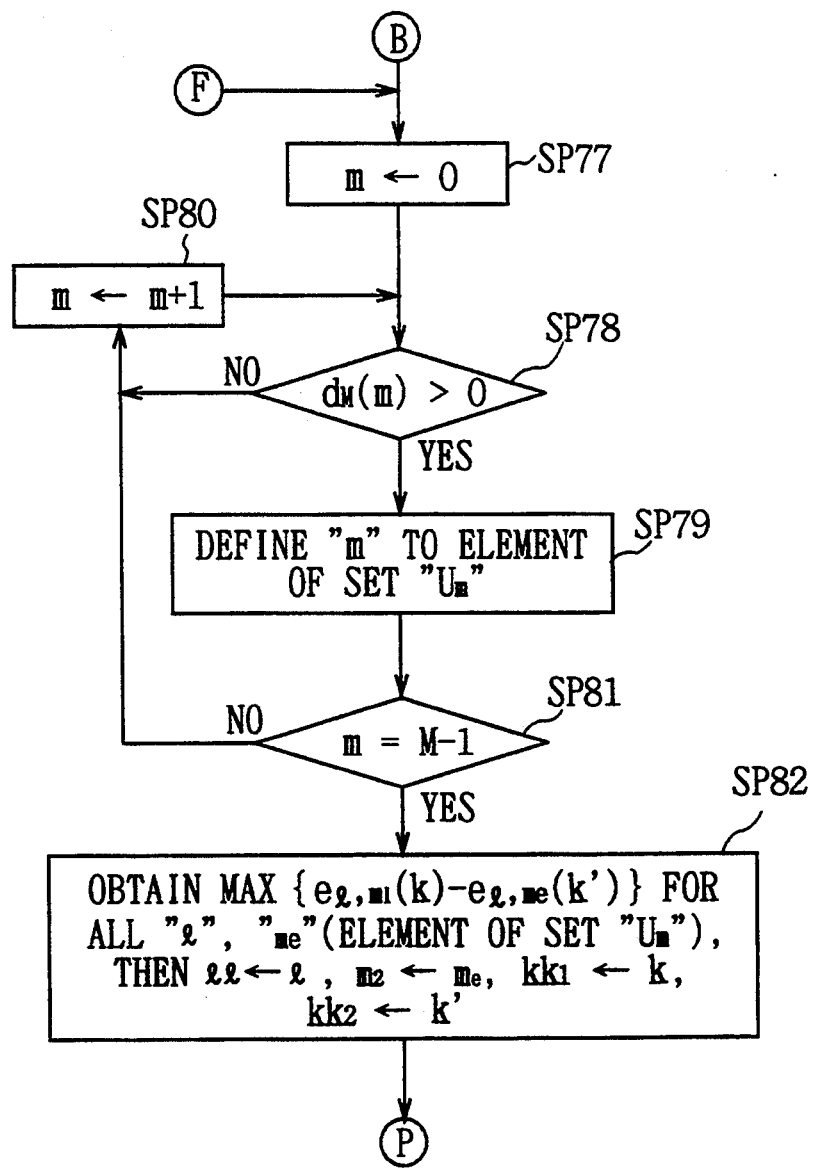
FIG. 7 is a flow chart showing an algorithm of the sub-filter DC gain matching as same as FIG. 4.
Figure 8:
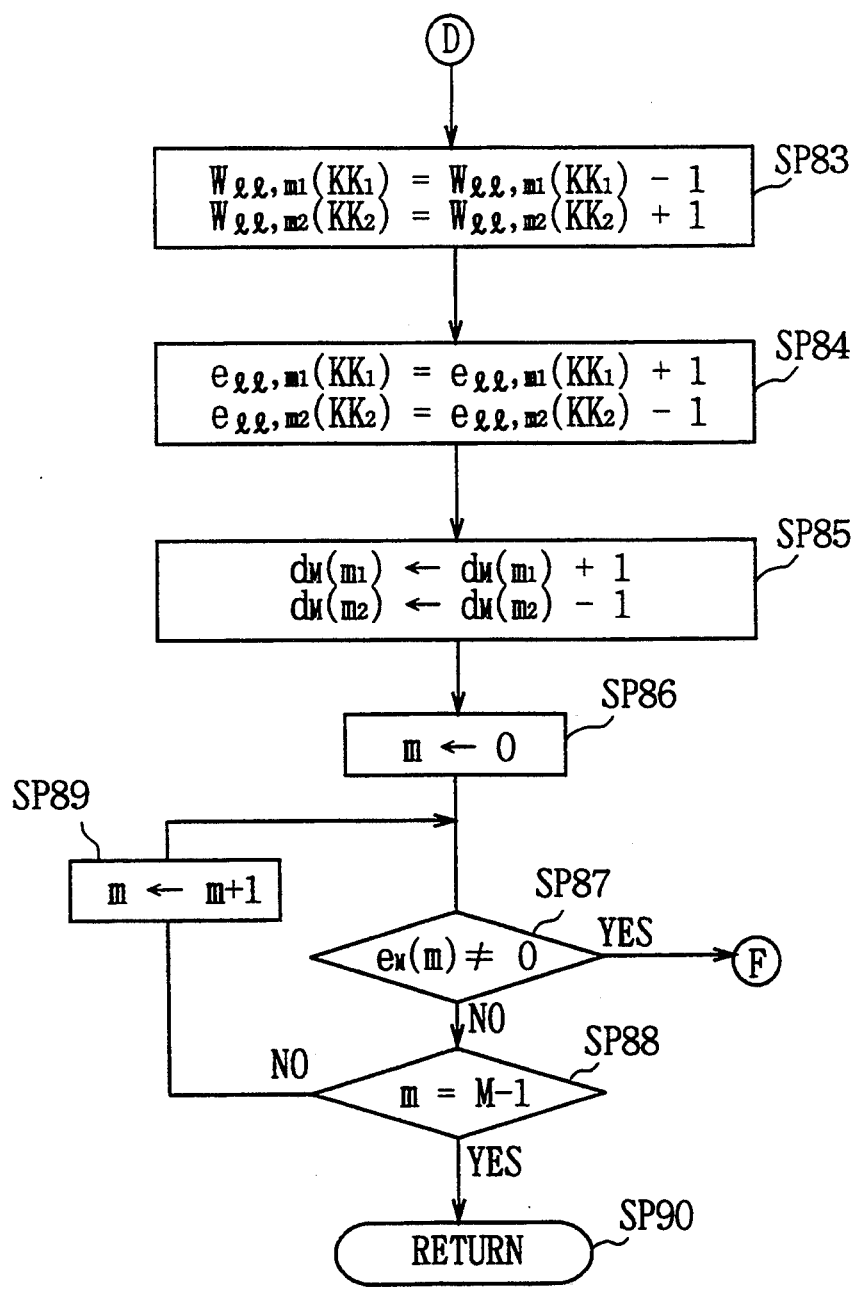
FIG. 8 is a flow chart showing an algorithm of the sub-filter DC gain matching as same as FIG. 4.

Then, at step SP2 of FIG. 1, the CPU executes a subroutine of the second sub-filter DC gain matching processing program SP30 as illustrated in FIG. 3, in order to execute the DC gain matching regarding the sub-filters which have negative value errors from the target value.

More specifically, the CPU enters from step SP30 and at step SP31, obtains the total sums $S'_{dL}$ and $S'_{dM}$ having negative values regarding each of the error sequences $d_L(l)$ and $d_M(m)$, respectively. Then at step SP32, an inquiry is made as to whether at least one of the total sums ($S'_{dL}$ or $S'_{dM}$) is zero. If the inquiry is answered in the affirmative, the CPU proceeds to the step S33, terminates the second sub-filter DC gain matching processing program SP30 and continues to step SP3 of the magic square DC gain matching processing program step SP0 of FIG. 1.

If the determination of step S32 is answered in the negative, the CPU executes the step SP34–step SP36 and selects one of the total sums ($S'_{dL}$ or $S'_{dM}$) having the smaller absolute value in and that absolute value becomes "i" (if the absolute values are the same, either one will be acceptable).

The relationship between the total sums $S_{dL}$ and $S_{dM}$ utilized in the DC gain matching operation of the first sub-filter DC gain matching processing program SP10 on the basis of the equation (14) and the total sums $S'_{dL}$ and $S'_{dM}$ are expressed as follows:

$$S_{dL} > S_{dM} \text{ then } |S'_{dL}| > |S'_{dM}| \quad (19)$$

$$S_{dL} < S_{dM} \text{ then } |S'_{dL}| < |S'_{dM}| \quad (20)$$

Accordingly, if the total sum $S_{dL}$ is selected at steps SP14–SP16 of the DC gain matching operation of the first sub-filter DC gain matching processing program SP10 for example, the corresponding sum total $S'_{dL}$ will be selected as well.

Then the CPU executes the step SP38–step SP41 until the value of "i" becomes "0" and obtains the minimum value of $(e_{l,m}(k))$ for all "l" and "m" having the total sums "$d_L(l) < 0$" and "$d_M(m) < 0$" and performs the calculations on the following equations where "l", "m" and "k" have corresponding minimum values "ll", "mm" and "kk", respectively:

$$W_{ll,mm}(kk) = W_{ll,mm}(kk) - 1 \quad (21)$$

$$e_{ll,mm}(kk) = e_{ll,mm}(kk) + 1 \quad (22)$$

$$d_L(ll) = d_L(ll) + 1 \quad (23)$$

$$d_M(mm) = d_M(mm) + 1 \quad (24)$$

At step SP41, "i" becomes "i−1", and when "i" becomes "0" the CPU proceeds to step SP33 and terminates said second sub-filter DC gain matching processing program SP30, and continues to step SP3 of the magic square DC gain matching processing program SP0.

At this point, all elements of either one of the error sequences $d_L(l)$ and $d_M(m)$ become zero; i.e., the DC gain matching on either one of the sub-filters has been completed.

Accordingly, the CPU enters the subroutine of the third sub-filter DC gain matching processing program SP50 at the step SP3 of the magic square DC gain matching processing program SP0 as shown in FIG. 4–FIG. 8, and performs the DC gain matching for the coefficients of the sub-filters having non-zero elements on either one of the error sequence.

At this point, it may be assumed that the M:L conversion sub-filter DC gain matching is complete and a non-zero element exists on the error sequence $d_M(m)$. Accordingly, the CPU obtains an affirmative result at the step SP51 of FIG. 4 and continues to step SP52. The CPU executes steps SP52–SP55 whereat "m" in the error sequence $d_M(m)$ is set to zero and is incremented by one. Then "m" at the time when the first non-zero element appears, becomes "$m_l$" and non-zero element $d_M(m)$ becomes "$d_1$".

Then at step SP56, the CPU determines whether the nonzero element "$d_1$ is positive or negative and if an affirmative result is obtained, executes steps SP57–SP61 and defines "m" to satisfy "$d_M(m) < 0$" as an element of set "$U_m$" in the error sequence $d_M(m)$. Then the CPU executes the steps SP62–SP65 and obtains the maximum value of $(e_{l,m_l}(k) - e_{l,m_e}(k'))$ for all "l" and $m_e$, where the element of set "$U_m$" is "$m_e$". Further "l" "$m_e$", "k", "k'" have corresponding maximum values defined as "ll", "$m_2$", "$kk_1$", "$kk_2$", respectively. The CPU then performs the calculations in equations:

$$W_{ll,m1}(kk_1s) = W_{ll,m1}(kk_1) + 1 \quad (25)$$

$$W_{ll,m2}(kk_2) = W_{ll,m2}(kk_2) - 1 \quad (26)$$

$$e_{ll,m2}(kk_1) = e_{ll,m2}(kk_1) - 1 \quad (27)$$

$$e_{ll,m2}(kk_2) = e_{ll,m2}(kk_2) + 1 \quad (28)$$

$$d_M(m_1) = d_M(m_1) - 1 \quad (29)$$

$$d_M(m_2) = d_M(m_2) + 1 \quad (30)$$

Then, the CPU executes steps SP66–SP69 and determines whether any non-zero elements exist in the error sequence $d_M(m)$, and if a non-zero element exists, the CPU returns to the step SP52 and repeats the process stated above.

Conversely, if the non-zero element no longer exists in error sequence $d_M(m)$, the CPU terminates the third sub-filter DC gain matching processing program SP50 at step SP70 and proceeds to step SP4 of the magic square DC gain matching program SP0. As a result, the CPU terminates the magic square DC gain matching processing program SP0 at step SP4, and thus all DC gain matching operations end.

If the inquiry at step SP56 is negative, the CPU executes steps SP77–SP81 and defines "m" to satisfy "$d_M(m) > 0$" as the element of set "$U_m$" in the error sequence $d_M(m)$. Then, the CPU executes the steps SP82–SP85 and defines the element of set "$U_m$" as "$m_e$" and obtains the minimum value of $(e_{l,m_l}(k) - e_{l,m_e}(k'))$ for all "l" and "$m_e$". Furthermore, where "l", "$m_e$", "k", "k'", have corresponding minimum values defined as "ll", "$m_2$", "$kk_1$", "$kk_2$" respectively, the CPU performs the calculations in the following equations:

$$W_{ll,m1}(kk_1) = W_{ll,m1}(kk_1) - 1 \quad (31)$$

$$W_{ll,m2}(kk_2) = W_{11,m2}(kk_2) + 1 \quad (32)$$

$$e_{ll,m1}(kk_1) = e_{ll,m1}(kk_1) + 1 \quad (33)$$

$$e_{ll,m2}(kk_2) = e_{ll,m2}(kk_2) - 1 \quad (34)$$

$$d_M(m_1) = d_M(m_1) + 1 \quad (35)$$

$$d_M(m_2) = d_M(m_2) - 1 \quad (36)$$

Then, the CPU executes steps SP86–SP89 and determines whether non-zero elements exist in the error sequence $d_M(m)$ and if a non-zero element exists, the CPU returns to step SP52 and repeats the process stated above.

Conversely, if the non-zero element no longer exists in error sequence $d_M(m)$, the CPU terminates the third sub-filter DC gain matching processing program SP50 at step S90 and proceeds to step SP4 of the magic square DC gain matching processing program SP0. As a result, the CPU terminates said magic square DC gain matching processing program SPO at SP4 and thus all DC gain matching operations end.

In the case where a negative result is obtained at the step SP51, all elements of the error sequence $d_M(m)$ are zero and there exist non-zero elements in the error sequence $d_L(l)$ and accordingly, the same process to be described below is executed and the M:L conversion sub-filter gain matching is performed.

(3-3) The Operation of Magic Square DC Gain Matching

FIGS. 9A to 9D shows examples of the DC gain matching operation of the sampling rate converter which performs the M:L conversion and L:M conversion in case when, for examples, "M=4" and "L=3". The algorithm will be explained hereinbelow in accordance with the embodiment of FIG. 9A.

First of all, the operation of sub-filter DC gain matching processing program SP10 described above, is performed; i.e., the operation, for DC gain matching regarding the sub-filter which has positive value errors from the target value, is performed.

The sum totals of the positive value of error sequences $d_L(l)$, $d_M(m)$ becomes "+3" and "+5", respectively. Since the sum totals of the above two positive values are both non-zeros, the operation is continued and since "3" has the smaller absolute value in these sum totals, "i=3".

Accordingly, three numbers are chosen in the order from the largest quantization error $(e_{l,m}(k))$ in the positive direction, wherein the arrangement elements $w_{l,2}(k)$, $w_{l,3}(k)$ and "l" are incremented respectively. Supposing that two elements from $w_{l,2}(k)$ and one element from $w_{l,3}(k)$ are chosen in this example. As shown in FIG. 9B the operation results in "$d_L(1)=0$", "$d_M(2)=0$ and $d_M(3)=2$".

Then, the second operation of the sub-filter DC gain matching processing program SP30, i.e., the operation for DC gain matching regarding the sub-filter which has negative value errors from the target values, is performed.

At first, the total sums of error sequences $d_L(l)$ and $d_M(m)$ become "−4" and "−6", respectively. As a result, since one of the two total sums is non-zero, the operation is continued, where "−4" is the smaller absolute value and thus "i=4".

Accordingly, in the arrangement elements of $w_{0,0}(k)$, $w_{0,1}(k)$, $w_{2,0}(k)$, $w_{2,1}(k)$, which satisfy "$d_L(l)<0$" and "d (m)<0" four numbers are chosen in the order from the largest quantization error $(e_{l,m}(k))$ in the negative direction, wherein "l" is incremented respectively. In this example, suppose that two of the arrangement elements of $w_{0,1}(k)$, one of the arrangement elements of $w_{2,0}(k)$ and one of the arrangement elements of $w_{2,1}(k)$, are chosen. As shown in FIG. 9C, the operation results in "$d_L(0)=0$", "$d_L(2)=0$", "$d_M(0)=-1$" and "$d_M(1)=-1$".

Lastly, the operation of the third sub-filter DC gain matching processing program SP50 will be performed. At this point, all elements of the error sequence $d_L(l)$ are "0" and it should be clear that the M:L conversion sub-filter DC gain matching has been completed.

Accordingly, in the error sequence $d_M(m)$, "m" is incremented from zero to "1" and the first non-zero element is searched. In this example, "$m_1=0$" and "d=−1". At this point, "$d_1<0$" and set "m" satisfies "$d_m(m)>0$" as an element of set "$U_m$" in the error sequence $d_M(m)$. Further, in this case, "$U_m=3$" where the element of set "$U_m$" member is "$m_e$". Elements "1" and "$m_e$" the search for "ll", "$m_e$", "k" and "k'" satisfy the minimum value of $(ee, 0(k) - ee, m_e(k'))$. In this example, suppose that $w_{0,0}(kk_1)$ and $w_{0,3}(kk_2)$ are chosen. As a result, in respect to said equations (31) to (36), the following equations will be performed.

$$w_{0,0}(kk_1) = w_{0,0}(kk_1) - 1 \quad (37)$$

$$w_{0,3}(kk_2) = w_{0,3}(kk_2) + 1 \quad (38)$$

$$e_{0,0}(kk_1) = e_{0,0}(kk_1) + 1 \quad (39)$$

$$e_{0,3}(kk_2) = e_{0,3}(kk_2) - 1 \quad (40)$$

$$d_M(0) = d_M(0) + 1 \quad (41)$$

$$d_M(3) = d_M(3) - 1 \quad (42)$$

The above described operation is repeated and when no non-zero elements exist, all DC gain matching operation is terminated. In this case, if the operation is repeated once, the non-zero elements no longer exist (FIG. 9D).

According to the construction as discussed above, since filter coefficients are arranged in an L x M matrix based on the L:M conversion and the M:L conversion of sampling frequencies and coefficient values are operated in order that the sum totals of coefficients of L numbers in the row direction are equalized and simultaneously the sum totals of M numbers in the column direction are equalized, the filter coefficients are corrected such that the DC gain becomes constant for both the M:L conversion and the L:M conversion. Therefore, the sampling rate converter which is capable of converting sampling frequencies in two-way directions can be realized.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. Sampling rate converter for converting a sampling frequency L of a digital signal to a sampling frequency M (L:M conversion) or for converting a sampling frequency M of a digital signal to a sampling frequency L (M:L conversion), while utilizing the same filter coefficients and maintaining a constant predetermined DC gain for both conversions, said sampling rate converter comprising:

an over-sampler for multiplying said sampling frequency L or M by M or L, respectively, during said L:M conversion and said M:L conversion, respectively;

a rate converting filter receiving an output of said over-sampler for restricting the frequency band of said output;

a central processing unit (CPU) for supplying filter coefficients to said rate converting filter and having means for quantizing said filter coefficients, means for arranging the quantized filter coefficients into a three-dimensional array including rows and columns, means for determining a ratio between a total sum of values of said rows and columns of the array of quantized filter coefficients, and means for correcting each of said quantized filter coefficients in response to the determined ratio so as to maintain said predetermined DC gain; and a down-sampler receiving an output of said rate converting filter for multiplying the rate converted frequencies 2. The sampling rate converter of claim 1, wherein said means for correcting each of said quantized filter coefficients is further responsive to deviations of the latter from corresponding predetermined target values.

3. The sampling rate converter of claim 2, wherein the deviations of said quantized filter coefficients have either positive or negative values relative to said predetermined value on the basis of whether said quantized filter coefficients are greater than or less than said corresponding predetermined target values, respectively.

4. The sampling rate converter as in claim 3 wherein said ratio between the total sum of values of said rows and columns equals "1".

5. The sampling rate converter of claim 3, wherein said means for correcting comprises means for converting the positive values of said quantized filter coefficients to "0" values, such that said deviations are corrected.

6. The sampling rate converter of claim 3, wherein said means for correcting comprises means for converting the negative values of said quantized filter coefficients to "0" values, such that said deviations are corrected.

* * * * *